(12) United States Patent
Kim (10) Patent No.: US 7,807,018 B2
(45) Date of Patent: Oct. 5, 2010

(54) ETCHING APPARATUS FOR USE IN MANUFACTURE OF FLAT PANEL DISPLAY DEVICE AND MANUFACTURING METHOD USING THE SAME

(75) Inventor: Chun Il Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 475 days.

(21) Appl. No.: 11/455,718

(22) Filed: Jun. 20, 2006

(65) Prior Publication Data
US 2007/0151950 A1 Jul. 5, 2007

(30) Foreign Application Priority Data
Dec. 29, 2005 (KR) ...................... 10-2005-0133995

(51) Int. Cl.
*B23F 1/00* (2006.01)
*H01L 21/306* (2006.01)
(52) U.S. Cl. .................................... 156/345.23; 65/486
(58) Field of Classification Search ................ 156/345, 156/345.22, 345.23; 414/935–941; 118/718; 65/260, 486
See application file for complete search history.

(56) References Cited

U.S. PATENT DOCUMENTS 3,894,629 A * 7/1975 Wakabayashi ............... 198/718
4,483,651 A * 11/1984 Nakane et al. .............. 414/217
5,357,077 A * 10/1994 Tsuruta .................. 219/121.68

* cited by examiner

*Primary Examiner*—Sylvia R. MacArthur
(74) *Attorney, Agent, or Firm*—McKenna Long & Aldridge LLP (57) ABSTRACT

Disclosed herein are an apparatus and method for manufacturing a flat panel display device. The apparatus and method for manufacturing a flat panel display device contribute to a compact apparatus for etching a substrate and damage or breakage prevention of the substrate during the transfer of the substrate by virtue of stoppers. The etching apparatus comprises a loader for loading or unloading a substrate, an etching device for etching the substrate into a desired shape, a DI rinsing device for rinsing fine particles and etchant generated during the etching process from the etched substrate, an air knife for drying the rinsed substrate, and one or more turn stages provided at one or more locations between the above respective devices, and adapted to change a transfer direction of the substrate.

11 Claims, 6 Drawing Sheets

ETCHING APPARATUS FOR USE IN MANUFACTURE OF FLAT PANEL DISPLAY DEVICE AND MANUFACTURING METHOD USING THE SAME

This application claims the benefit of Korean Patent Application No. 10-2005-0133995, filed on Dec. 29, 2005, which is hereby incorporated by reference as if fully set forth herein.

BACKGROUND OF THE INVENTION

1. Field of the Invention

The present invention relates to an apparatus and method for manufacturing a flat panel display device, and more particularly, to an apparatus for etching a substrate that may be used in a display device, such as a liquid crystal display device, and a manufacturing method using the same.

2. Discussion of the Related Art

Generally, a thin film transistor array is completed via several deposition and etching processes.

The etching processes may be is classified into a dry etching method and a wet etching method.

The dry etching method removes a semiconductor layer or metal using plasma gas. Examples of the dry etching method may include a plasma etching, sputtering etching, or reactive ion etching.

The wet etching method etches a layer to be etched, into a desired form using a chemical solution that chemically reacts with and melts the target layer. Examples of the wet etching method may include a dip etching, or spray etching.

Figure 1:
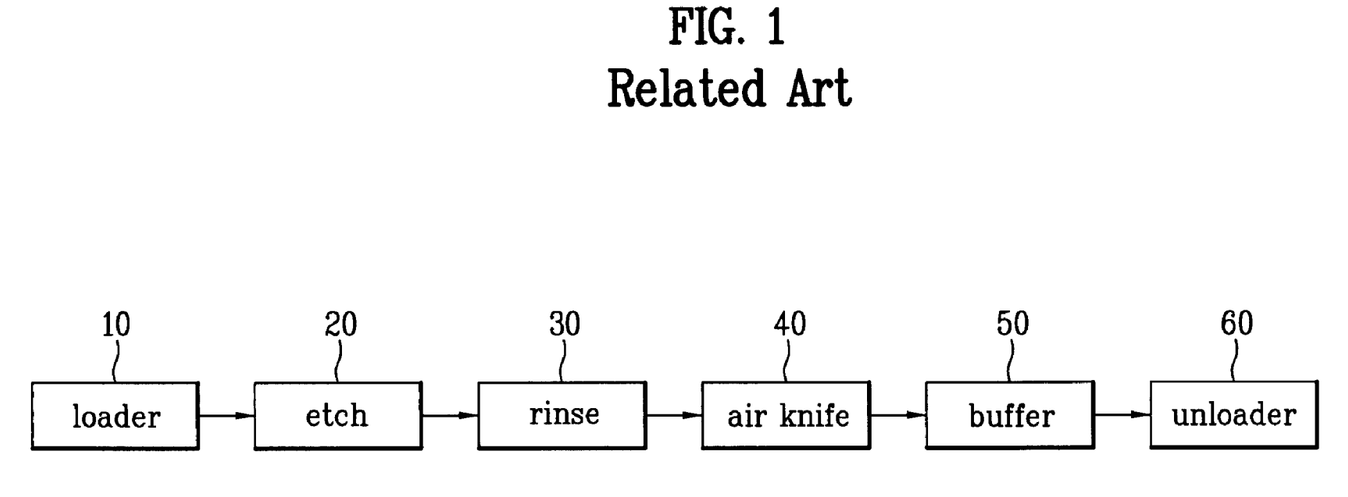
FIG. 1 is a block diagram schematically illustrating the layout of an etching apparatus for use in the manufacture of a flat panel display device in accordance with the related art.

FIG. 1 illustrates the overall layout of a related art wet etching apparatus.

As shown in FIG. 1, the related art wet etching apparatus may include a loader 10, an etching device 20, a de-ionized water (hereinafter "DI") rinsing device 30, an air knife 40 that serves as a drying device, a buffer 50, and an un-loader 60.

One problem with the above related art wet etching apparatus is that the above mentioned devices 10, 20, 30, 40, 50, and 60 are arranged linearly as shown in FIG. 1, and therefore, compactness of the overall layout cannot be achieved.

In particular, such an increase in layout design results in the need for a larger factory required for building the wet etching apparatus. Accordingly, there exists an urgent need to solve at least the above problem.

SUMMARY OF THE INVENTION

Accordingly, the present invention is directed to an etching apparatus that may be used in the manufacture of a flat panel display device and a manufacturing method using the same that substantially obviate one or more of the problems due to limitations and disadvantages of the related art.

An advantage of the present invention is to provide a compact apparatus for etching a substrate, that maybe used in the manufacture of a flat panel display device and a method for manufacturing the flat panel display device using the etching apparatus.

Another advantage of the present invention is to provide an etching apparatus that may be used in the manufacture of a flat panel display device which includes at least one stopper having an improved structure that prevents damage to or breakage of a substrate during transfer of the substrate.

Additional advantages and features of the invention will be set forth in the description which follows, and will become apparent to those having ordinary skill in the art upon examination of the following or may be learned by practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, an etching apparatus for use in the manufacture of a flat panel display device, comprises: a loader for loading or unloading a substrate; an etching device for etching the substrate into a desired shape; a DI rinsing device for rinsing fine particles generated during the etching process; an air knife for drying the substrate; and one or more turn stages provided at one or more locations between the above respective devices, and adapted to change a transfer direction of the substrate.

In accordance with another aspect of the present invention, there is provided an etching apparatus, for use in the manufacture of a flat panel display device, comprising one or more turn stages for changing a processing direction of a substrate, wherein each of the turn stages includes: one or more carry-in roller units installed to accept the substrate; one or more carry-out roller units installed to discharge the substrate, the carry-out roller units having an upwardly and downwardly movable structure; and at least one stopper having upper and lower ends for preventing the substrate from being excessively introduced onto the relevant turn stage, the upper and lower ends of the stopper having different diameters from each other.

In accordance with yet another aspect of the present invention, there is provided a method for manufacturing a flat panel display device comprising: loading a substrate into an etching device by controlling a loader; etching the loaded substrate into a desired shape by controlling the etching device; turning and transferring the substrate discharged from the etching device toward a DI rinsing device by controlling a carry-in turn stage and a carry-out turn stage; rinsing the substrate transferred by the turn stages by controlling the DI rinsing device; drying the rinsed substrate discharged from the DI rinsing device by controlling an air knife; and unloading the substrate, discharged from the air knife, by controlling the loader.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Now, an embodiment of an etching apparatus for use in the manufacture of a flat panel display device in accordance with the present invention will be explained in more detail with reference to FIGS. 2 to 7.

Figure 2:
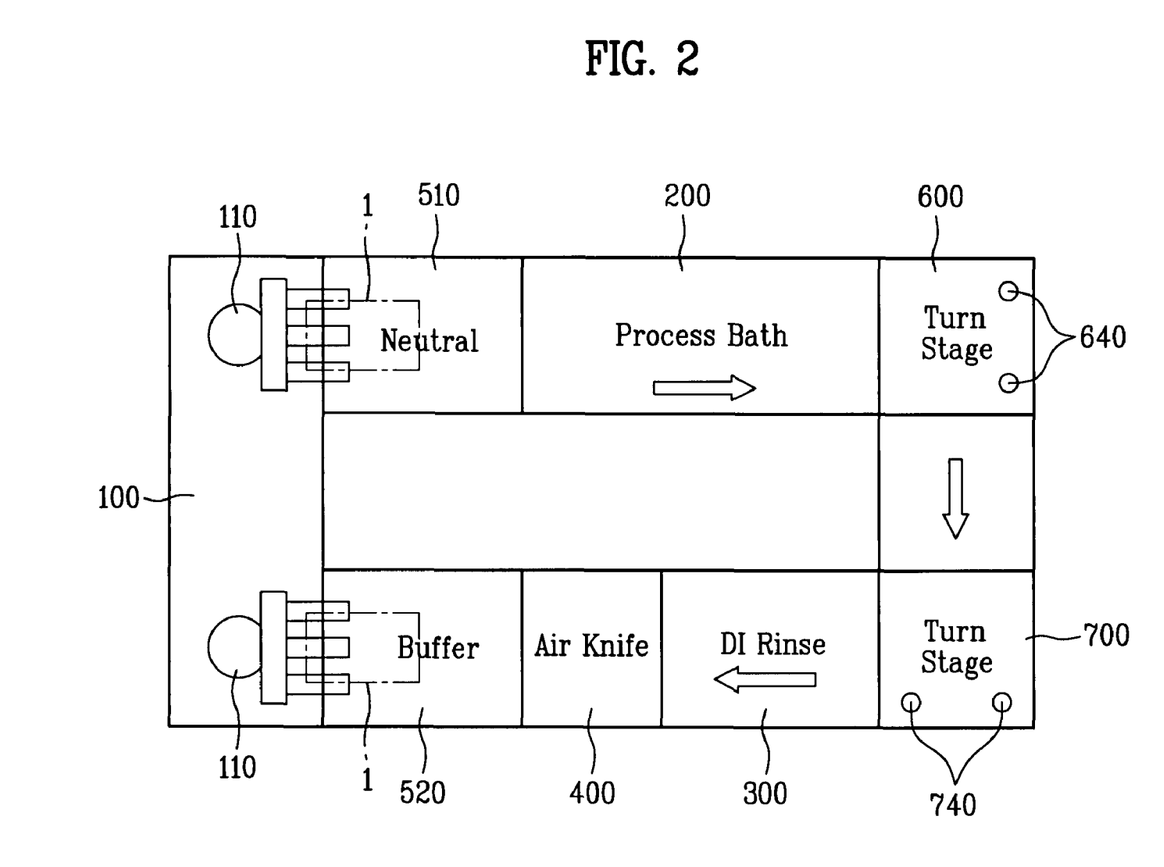
FIG. 2 is a block diagram schematically illustrating the layout of an etching apparatus for use in the manufacture of a flat panel display device in accordance with an embodiment of the present invention.

First, FIG. 2 is a block diagram schematically illustrating the layout of respective devices that may be included in the etching apparatus for use in the manufacture of a flat panel display device in accordance with an embodiment of the present invention.

As will be appreciated from FIG. 2, the etching apparatus for use in the manufacture of a flat panel display in accordance with an embodiment of the present invention basically includes a loader 100, an etching device 200 having a process bath, a DI rinsing device 300, an air knife 400 that serves as a drying device, and a plurality of turn stages 600 and 700.

Here, the loader 100 is a device for loading or unloading a substrate 1. The loader 100 has one or more robot arms 110.

Of course, the loader 100 may use conveyors or rollers for loading or unloading the substrate 1.

The etching device 200 is a device for accepting the substrate 1 transferred from the loader 100 and etching the substrate 1 into a desired shape.

In an embodiment of the present invention, the etching device 200 is a wet etching device configured to perform an etching process using an etching solution. The etching solution is fed from an external source not shown.

In particular, the etching device 200 is arranged parallel to the loader 100.

Preferably, as shown in FIG. 2, a neutral station 510 is interposed between the loader 100 and the etching device 200. The neutral station 510 prevents strong acid solution that exists in the etching device 200 from corroding the loader 100.

The DI rinsing device 300 is a device for accepting the etched substrate 1, and for rinsing fine particles and etchant solution from the substrate 1, which are separated from the substrate 1 during the etching process.

In the present embodiment, the DI rinsing device 300 removes the etchant solution which is used in the etching process using de-ionized (DI) water.

In particular, the DI rinsing device 300 may be arranged to perform a rinsing process in a direction opposite to the etching process that is performed by the etching device 200.

Specifically, as shown in FIG. 2, the DI rinsing device 300 may be located opposite to the etching device 200.

The air knife 400 is a device for accepting the substrate 1 rinsed by the DI rinsing device 300 and drying the substrate 1.

In the present embodiment, the air knife 400 is adapted to remove moisture remaining on the substrate 1 by injecting air toward the substrate 1.

The air knife 400 is located at a substrate outlet side of the DI rinsing device 300, and the substrate 1, having passed through the air knife 400, is unloaded by the loader 100.

As shown in FIG. 2, a buffer 520 may be interposed between the air knife 400 and the loader 100 for temporarily storing the dried substrate.

The turn stages 600 and 700 are devices configured to turn the substrate 1 to follow a prescribed processing direction.

The turn stages 600 and 700 may be located at one or more positions between the above described devices 200, 300, and 400. In an embodiment of the present invention, the turn stages 600 and 700 may be located at a substrate outlet side of the etching device 200 and a substrate inlet side of the DI rinsing device 300, respectively.

In particular, according to an embodiment of the present invention, one of the turn stages is used as a carry-in turn stage 600, and the other turn stage is used as a carry-out turn stage 700.

In the present embodiment, the carry-in turn stage 600 is configured to accept the substrate 1 transferred from the etching device 200, and to transfer the substrate 1 in a direction substantially perpendicular to the substrate acceptance direction.

The carry-out turn stage 700 is configured to accept the substrate 1 transferred from the carry-in turn stage 600 and to discharge the substrate 1 in a direction substantially perpendicular to the substrate acceptance direction, i.e. in a direction where the DI rinsing device 300 is located.

The above described respective turn stages 600 and 700 may adopt various structures for turning the substrate 1. Among the various turning structures, according to an embodiment of the present invention, a series of structures for transferring the substrate 1 while lifting and rolling the substrate 1 to both directions substantially perpendicular to each other are adopted.

Hereinafter, the series of structures for transferring the substrate 1 in its turned state will be explained in more detail with reference to FIGS. 3 to 7.

Figure 3:
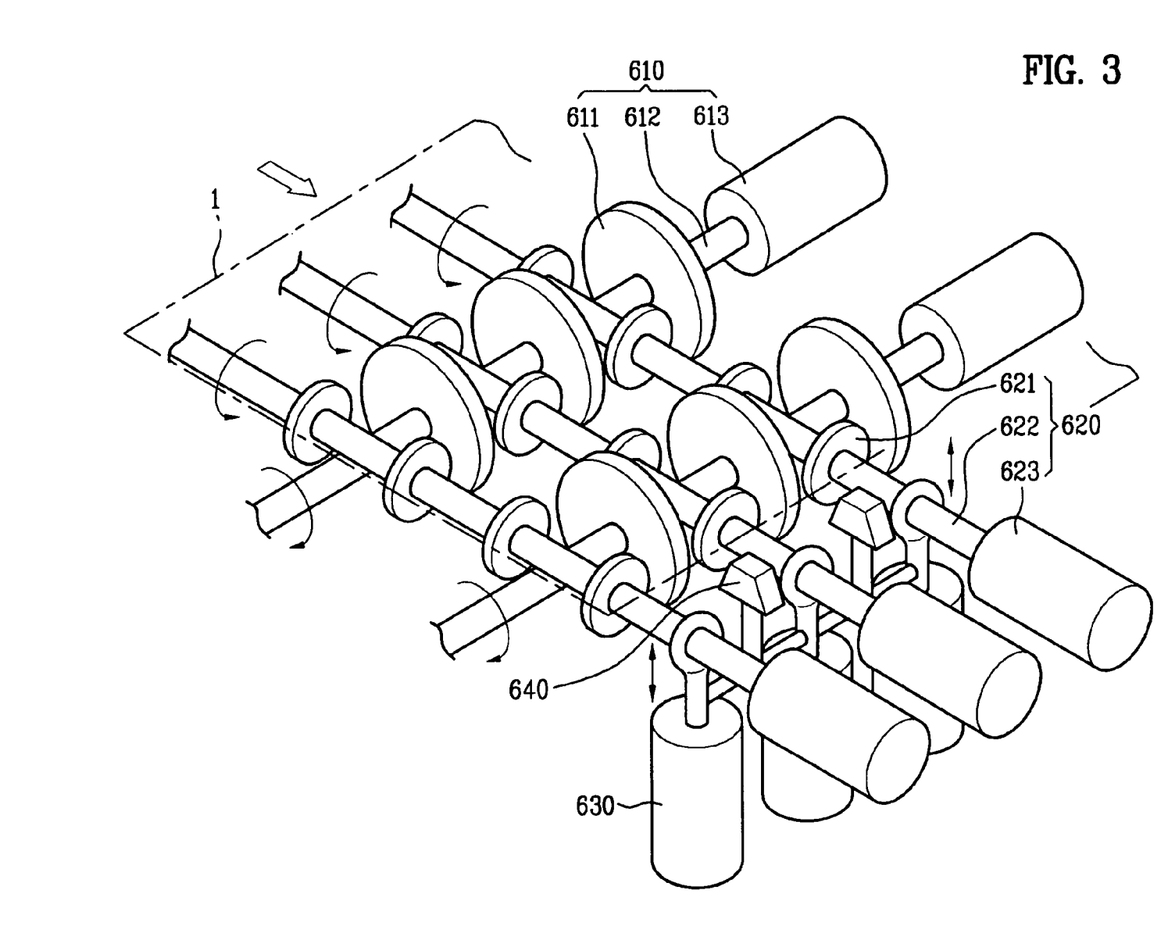
FIG. 3 is a schematic enlarged perspective view of the structure of a carry-in turn stage in accordance with an embodiment of the present invention.
Figure 4:
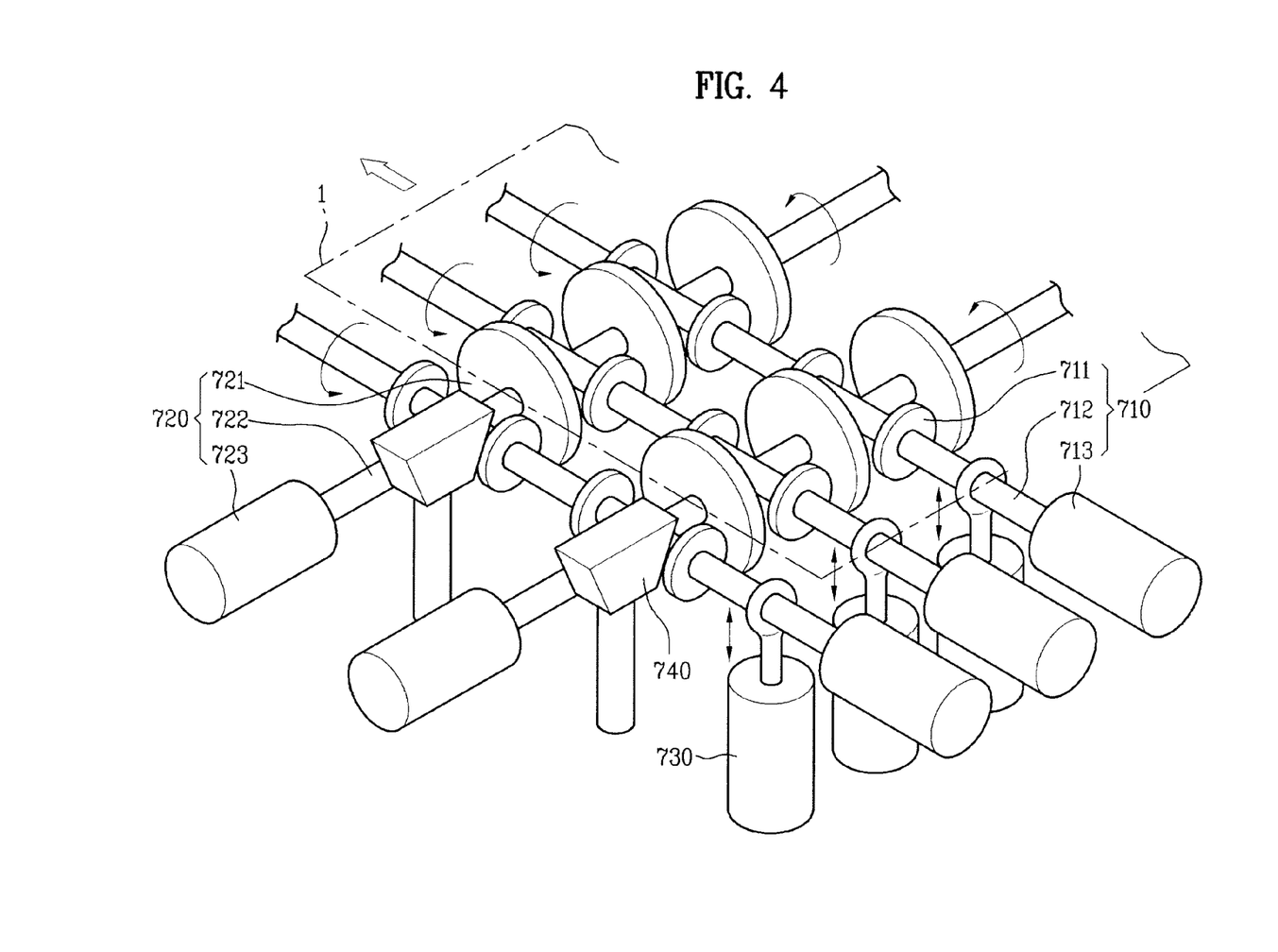
FIG. 4 is a schematic enlarged perspective view of a carry-out turn stage in accordance with an embodiment of the present invention.

First, as shown in FIGS. 3 and 4, each of the carry-in turn stage 600 and the carry-out turn stage 700 includes: one or more carry-in roller units 610 or 710 installed to accept the substrate 1; and one or more carryout roller units 620 or 720 installed to discharge the substrate 1.

Each of the carry-in roller units 610 and 710 and the carry-out roller units 620 and 720 include: a plurality of rollers 611, 621, 711 or 721 to perform rolling motion; a drive shaft 612, 622, 712, or 722 coupled through the rollers 611, 621, 711, or 721 to perform rotating motion; and a drive motor 613, 623, 713, or 723 to drive the drive shaft 612, 622, 712, or 722.

Here, the carry-out roller units 620 and 720 are installed to perform rolling motion in a direction substantially perpendicular to the carry-in roller units 610 and 710.

The carry-out roller units 620 of the carry-in turn stage 600 and the carry-in roller units 710 of the carry-out turn stage 700 are also installed to move upward and downward. For this, lifting cylinders 630 and 730 are coupled to at least one of the drive shafts of the carry-out roller units 620 and the carry-in roller units 710, respectively.

When one or more drive shafts 612, 622, 712, and 722 are provided, one or more drive motors 613, 623, 713, and 723 may be provided at the respective drive shafts 612, 622, 712, and 722 as shown in FIGS. 3 and 4. Alternatively, a single drive motor may be provided to operate the respective drive shafts 612, 622, 712, and 722 together by use of belts or chains.

In particular, the drive shaft 612 (hereinafter, referred to as "first drive shaft") of each carry-in roller unit 610 (hereinafter, referred to as "first carry-in roller unit") included in the carry-in turn stage 600 is located below the drive shaft 622 (hereinafter, referred to as "second drive shaft") of each carry-out roller unit 620 (hereinafter, referred to as "first carry-out roller unit"). Also, each roller 611 (hereinafter, referred to as "first roller") of the first carry-in roller unit 610 has a diameter larger than that of each roller 621 (hereinafter, referred to as "second roller") of the first carry-out roller unit 620.

Also, the drive shaft 712 (hereinafter, referred to as "third drive shaft") of each carry-in roller unit 710 (hereinafter, referred to as "second carry-in roller unit") included in the carry-out turn stage 700 is located above the drive shaft 722 (hereinafter, referred to as "fourth drive shaft") of each carry-out roller unit 720 (hereinafter, referred to as "second carry-out roller unit"). Each roller 711 (hereinafter, referred to as "third roller") of the second carry-in roller unit 710 has a diameter smaller than that of each roller 721 (hereinafter, referred to as "fourth roller") of the second carry-out roller unit 720.

Each of the turn stages 600 and 700 further includes at least one stopper 640 or 740 to prevent excessive introduction of the substrate 1. In the present embodiment, the stopper 640 or 740 is made of rubber or resin (for example, Teflon™).

Figure 6:
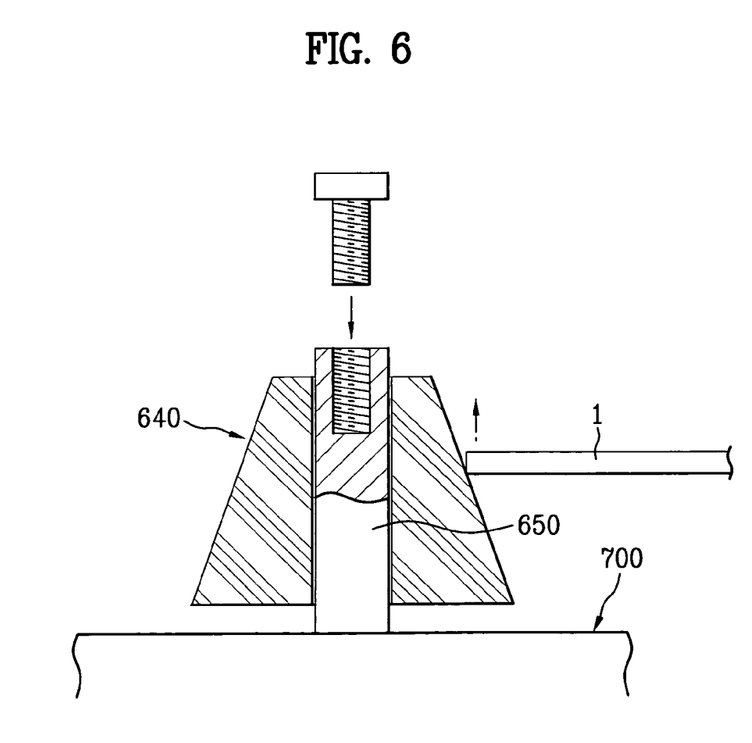
FIG. 6 is a schematic side sectional view explaining a first stopper in accordance with an embodiment of the present invention.
Figure 7:
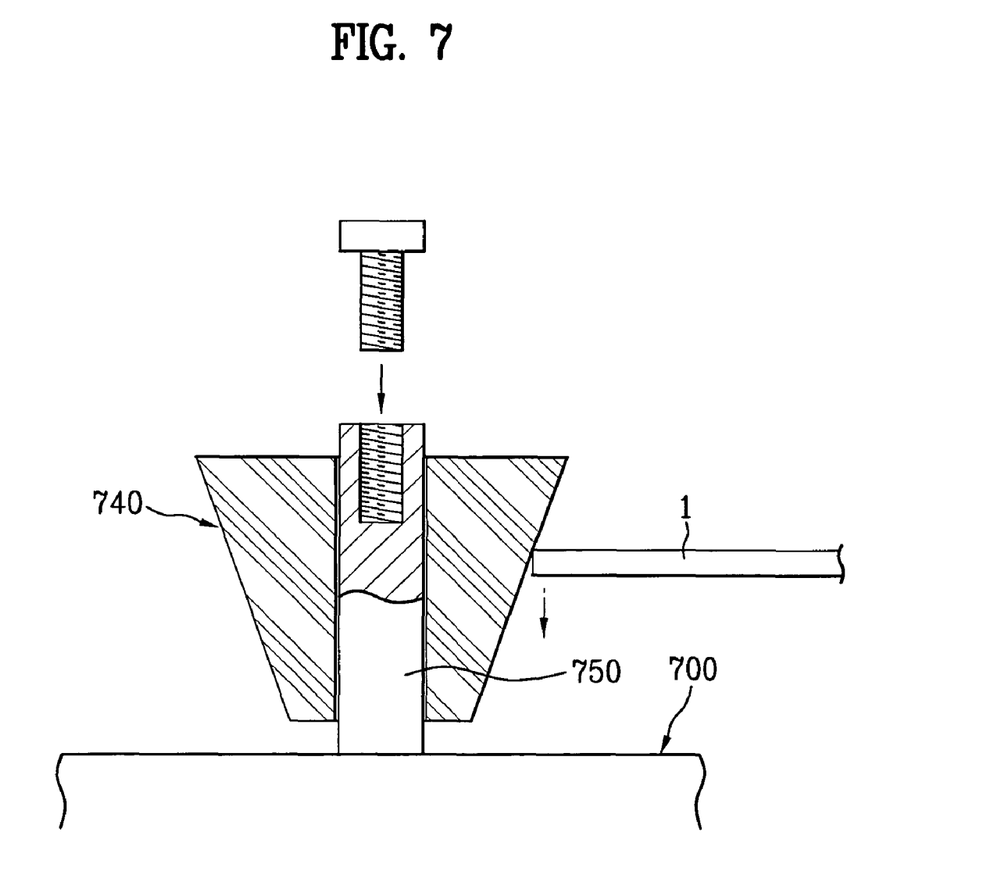
FIG. 7 is a schematic side sectional view explaining a second stopper in accordance with an embodiment of the present invention.

Preferably, as shown in FIGS. 6 and 7, each of the stoppers 640 and 740 is configured such that upper and lower ends thereof have different diameters from each other.

If the stoppers 640 and 740 have a cylindrical shape, they inevitably come into continuous contact with the substrate 1 that is introduced onto the turn stages 600 and 700, and are continuously exposed to an external shock. Therefore, the stoppers 640 and 740 suffer from a gradual deformation at a specific region of the periphery thereof due to the continuous external contact shock.

Figure 5:
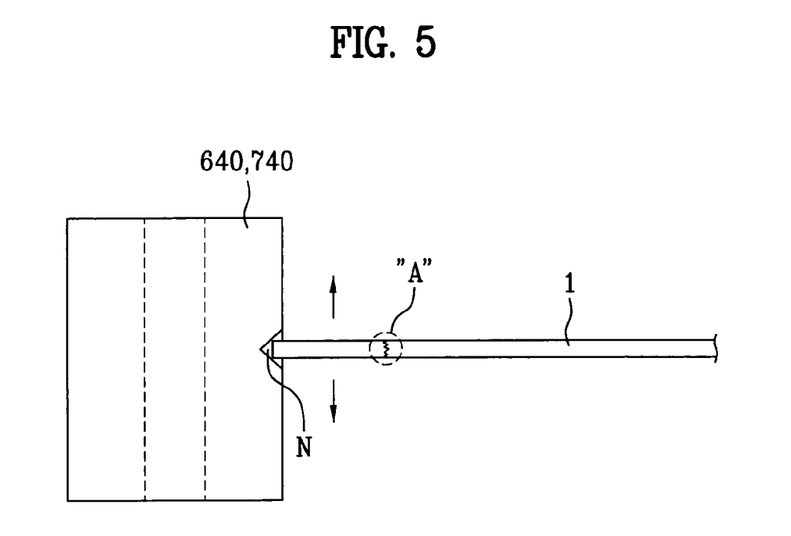
FIG. 5 is a schematic side sectional view explaining damage to a substrate when a stopper comes in contact with the substrate.

For example, as shown in FIG. 5, the specific region of the periphery of the stopper 640 or 740 may be dented due to frequent contact with the substrate 1.

In particular, if the substrate 1 is inserted into the dented region N (hereinafter, referred to as "damaged region") of the stopper 640 or 740 as a result of the deformation of the stopper 640 or 740, the substrate 1 is caught by the damaged region N of the stopper 640 or 740. Therefore, when the first carry-out roller units 620 and the second carry-in roller units 710 of the turn stages 600 and 700 are moved upward or downward, a part of the substrate 1 (indicated as circle "A" of FIG. 5) may be damaged.

Accordingly, most preferably, the stoppers 640 and 740 in accordance with the embodiment of a present invention are configured such that upper and lower ends thereof have different diameters from each other as shown in FIGS. 6 and 7.

As shown in FIG. 6, each stopper 640 (hereinafter, referred to as "first stopper") included in the carry-in turn stage 600 may be configured such that a diameter of the upper end is smaller than that of the lower end. For example, the first stopper 640 has a trapezoidal shape (e.g., cross section) wherein a diameter thereof gradually decreases from the lower end to the upper end.

The reason why the first stopper 640 is formed to have the trapezoidal shape is that the first carry-out roller unit 620 must be moved upward in order to transfer the substrate 1, introduced onto the carry-in turn stage 600, to the carry-out turn stage 700. That is, when the first stopper 640 has the trapezoidal shape, it is possible to completely prevent the substrate 1 from coming into contact with the first stopper 640 even if the substrate 1 is moved upward.

Also, as shown in FIG. 7, each stopper 740 (hereinafter, referred to as "second stopper") included in the carry-out turn stage 700 may be configured such that a diameter of the upper end is larger than that of the lower end. For example, the second stopper 740 has an inverted trapezoidal shape (e.g., cross sections) wherein a diameter thereof gradually increases from the lower end to the upper end.

The reason why the second stopper 740 is formed to have the inverted trapezoidal shape is that the second carry-in roller unit 710 must be moved downward in order to transfer the substrate 1, introduced onto the carry-out turn stage 700, to the DI rinsing device 300. That is, when the second stopper 740 has the inverted trapezoidal shape, it is possible to completely prevent the substrate 1 from coming into contact with the second stopper 740 even if the substrate 1 is moved downward.

Alternatively, the first and second stoppers 640 and 740 may have a multistage shape such that a diameter thereof decreases from the lower end to the upper end, or vice versa.

Preferably, the first and second stoppers 640 and 740 are coupled to the turn stages 600 and 700 by use of hinges 650 and 750, respectively, such that they can be pivotally rotated toward the introduction and/or discharge direction(s) of the substrate 1.

Adopting the pivotal turning structure has the effect of reducing friction between the substrate 1 and the stoppers 640 and 740 when the substrate 1 is introduced onto and discharged from the turn stages 600 and 700.

The above description explained the etching apparatus for use in the manufacture of a flat panel display device in accordance with an embodiment of the present invention, whereas the following description will explain a substrate etching process using the above described etching apparatus.

First, after the loader 100 is controlled such that the substrate 1 to be etched is loaded in the etching unit 200, the etching unit 200 is controlled to etch the loaded substrate 1.

Thereby, the substrate 1 is etched to have a desired shape in the etching unit 200. After that, the completely etched substrate 1 is discharged from the etching unit 200, and then, is transferred onto the carry-in turn stage 600 under the controlled operation of each turn stage.

In this case, the substrate 1 is first placed on the first carry-in roller units 610 of the carry-in turn stage 600. Thereby, the substrate 1 is able to be completely introduced onto the carry-in turn stage 600 as the first rollers 611 perform rolling motion in accordance with the operation of the first drive motors 613.

After the substrate 1 is introduced onto the carry-in turn stage 600 to some extent, the substrate 1 approaches the first stopper 640 included in the carry-in turn stage 600. Thereby, excessive introduction of the substrate 1 can be prevented by the stopper 640.

If the introduction of the substrate 1 is completed, the operation of the first carry-in roller units 610 stops, and simultaneously, the lifting cylinders 630 are operated to move the first carry-out roller units 620 upward.

Thereby, the substrate 1, which is placed on the first rollers 611 of the first carry-in roller units 610, is placed on a top of the second rollers 621 of the first carryout roller units 620.

When the first carry-out roller units 620 are moved upward, the substrate 1, which is moved upward along with the first carry-out roller units 620, risk of coming into contact with the first stopper 640 is minimized due to the trapezoidal shape of the stopper 640 having its diameter decrease from the lower end to the upper end. The stopper shape consequently prevents damage to the substrate 1.

If the upward movement of the first carry-out roller units 620 is completed, the second drive shafts 622 are rotated in accordance with the operation of the second drive motors 623, causing rolling motion of the second rollers 621. In this case, the rotating direction of the second drive shafts 622 is determined such that the second rollers 621 roll toward the second carry-in roller units 710.

As a result, the substrate 1 is moved in the rolling direction of the second rollers 621 of the first carry-out roller units 620, i.e. moved along a direction substantially perpendicular to the initial loading direction thereof, so as to be transferred to a top of the third rollers 711 of the second carry-in roller units 710 included in the carry-out turn stage 700. In this case, the second carry-in roller units 710 are previously moved upward relative to the second carry-out roller units 720 in accordance with the operation of the lifting cylinders 730.

When the substrate 1 is transferred to the carry-out turn stage 700 in accordance with the rolling motion of the first carry-out roller units 620, the substrate 1 may approach the first stopper 640. However, the first stopper 640 is pivotally coupled to the carry-in turn stage 600 to rotate toward the transfer direction of the substrate 1, and therefore, friction between the substrate 1 and the first stopper 640 is extremely low.

In particular, after the substrate 1 is introduced onto the carry-out turn stage 700 to some extent, the substrate 1 approaches the second stopper 740 of the carry-out turn stage 700. Thereby, excessive introduction of the substrate 1 can be prevented by the second stopper 740.

Once the substrate 1 is completely transferred to the carry-out turn stage 700 via the above described serial procedure, the second carry-in roller units 710 are moved downward in accordance with the operation of the lifting cylinders 730. As a result, the substrate 1 is placed on a top of the fourth rollers 721 of the second carry-out roller units 720.

When the substrate 1 is moved downward, the substrate 1 risk of the substrate coming into contact with the second stopper 740 is minimized because of the inverted trapezoidal shape of the second stopper 740. Thus, damage to the substrate 1 can be prevented.

If the downward movement of the substrate 1 is completed, the fourth drive shafts 722 of the second carryout roller units 720 are rotated in accordance with the operation of the drive motors 723, causing rolling motion of the fourth rollers 721.

Thereby, the substrate 1, which is placed on the top of the fourth rollers 721, is discharged in a direction substantially perpendicular to the substrate introduction direction (i.e. in a direction opposite to the initial loading direction of the substrate 1), thereby being transferred to the DI rinsing device 300.

After that, the DI rinsing device 300 is controlled to accept and rinse the substrate 1.

Specifically, as the substrate 1 passes through the DI rinsing device 300, fine particles and etchant solution, which are separated from the substrate 1 during the etching process, are rinsed by the DI rinsing device 300.

After being rinsed by the DI rinsing device 300, the substrate 1 is discharged from the DI rinsing device 300, and is transferred to the air knife 400. While passing through the air knife 400 the substrate 1 is able to be dried in accordance with the operation of the air knife 400.

Finally, the completely dried substrate 1 is temporarily stored in the buffer 520, and then, is unloaded by the loader 100. In this way, a series of processes for etching the substrate 1 can be completed.

As apparent from the above description, the etching apparatus for use in the manufacture of a flat panel display in accordance with an embodiment of the present invention has the following effects.

Firstly, according to the present invention, respective devices of the etching apparatus are arranged such that a series of processes can be subsequently performed in opposite directions. This has the effect of minimizing the overall layout of the etching apparatus.

Secondly, the etching apparatus of the present invention can minimize damage to a substrate when the substrate is transferred under operation of respective turn stages, resulting in an improved yield.

In particular, according to the present invention, each stopper, which is provided in the etching apparatus to prevent the substrate from being excessively introduced onto each turn stage, has a trapezoidal or inverted-trapezoidal shape. As a result, the etching apparatus can minimize damage to the substrate caused during the turning and upward and downward movements of the substrate.

Of course, while the embodiments are described herein with respect to turning of the substrates in directions substantially perpendicular to one another, one of skill in the art will appreciate that the principles described herein may be applied to turning the substrates in a variety of directions.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. An etching apparatus, for use in the manufacture of a flat panel display device, comprising one or more turn stages for changing a processing direction of a substrate, wherein each of the turn stages includes:

one or more carry-in roller units for accepting the substrate;

one or more carry-out roller units for discharging the substrate, the carry-out roller units having an upwardly and downwardly movable structure; and at least one stopper having upper and lower ends for traveling substrate along a path of the carry-in roller units and a path of the carry-out roller units, the upper end diameter of the stopper being smaller or lager than that of the lower end diameter thereof;

wherein the carry-out roller units are installed to perform rolling motion in a direction substantially perpendicular to the carry-in roller units, and at least one the stopper is located in the corner of the turn stages.

2. The etching apparatus as set forth in claim 1, wherein the turn stages include:

a carry-in turn stage for accepting the substrate transferred from a device that is used to perform a previous process; and a carry-out turn stage for accepting the substrate transferred from the carry-in turn stage and discharging the substrate to a device that is used to perform a later process.

3. The etching apparatus as set forth in claim 2, wherein an upper end diameter of the stopper included in the carry-in turn stage diameter thereof is smaller than that of the lower end diameter thereof.

4. The etching apparatus as set forth in claim 3, wherein the stopper included in the carry-in turn stage has a trapezoidal shape wherein a diameter thereof gradually decreases from the lower end to the upper end thereof.

5. The etching apparatus as set forth in claim 4, wherein the stopper included in the carry-in turn stage is mounted to be pivotally rotatable toward the introduction and/or discharge direction(s) of the substrate.

6. The etching apparatus as set forth in claim 2, wherein an upper end diameter of the stopper included in the carry-out turn stage is larger than the lower end diameter thereof.

7. The etching apparatus as set forth in claim 6, wherein the stopper included in the carry-out turn stage has an inverted trapezoidal shape wherein a diameter thereof gradually increases from the lower end to the upper end thereof.

8. The etching apparatus as set forth in claim 7, wherein the stopper included in the carry-out turn stage is mounted to be pivotally rotatable toward the introduction and/or discharge direction(s) of the substrate.

9. The etching apparatus as set forth in claim 1, wherein each stopper has a trapezoidal or an inverted trapezoidal shape wherein a diameter thereof gradually varies from the lower end to the upper end thereof.

10. The etching apparatus as set forth in claim 9, wherein each stopper is mounted to be pivotally rotatable toward the introduction and/or discharge direction(s) of the substrate.

11. The etching apparatus as set forth in claim 1, wherein each of the carry-out roller units and the carry-in roller units includes:

a roller for performing rolling motion;

a drive shaft coupled through the rollers; and a drive motor for driving the drive shaft; wherein the stopper is located in circumference of drive motor.

\* \* \* \* \*